(12) United States Patent
Ippolito et al.

(10) Patent No.: US 10,809,862 B2
(45) Date of Patent: Oct. 20, 2020

(54) SELF-TEST METHOD, CORRESPONDING CIRCUIT AND DEVICE

(71) Applicant: STMicroelectronics S.r.l., Agrate Brianza (IT)

(72) Inventors: Calogero Marco Ippolito, Aci Castello (IT); Angelo Recchia, Fasano (IT); Antonio Cicero, Palermo (IT); Pierpaolo Lombardo, Calascibetta (IT); Michele Vaiana, San Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/523,302

(22) Filed: Jul. 26, 2019

(65) Prior Publication Data

US 2020/0050305 A1 Feb. 13, 2020

(30) Foreign Application Priority Data

Aug. 9, 2018 (IT) .......................... 102018000008022

(51) Int. Cl.
| | |
|---|---|
| *G06F 3/045* | (2006.01) |
| *G06F 3/041* | (2006.01) |
| *G01R 31/28* | (2006.01) |
| *G09G 3/00* | (2006.01) |

(52) U.S. Cl.
CPC ......... *G06F 3/045* (2013.01); *G01R 31/2829* (2013.01); *G06F 3/04144* (2019.05); *G09G 3/006* (2013.01); *G06F 2203/04102* (2013.01)

(58) Field of Classification Search
CPC ................. G06F 3/045; G06F 3/04144; G06F 2203/04102; G01R 31/2829; G01R 31/52; G09G 3/006; H03K 2217/9605; H03K 17/9647

See application file for complete search history.

(56) References Cited

U.S. PATENT DOCUMENTS

| | | | |
|---|---|---|---|
| 2007/0126706 A1 | 6/2007 | Ziegler et al. | |
| 2011/0018837 A1* | 1/2011 | Chen ....................... | G06F 3/045 |
| | | | 345/174 |
| 2012/0187954 A1 | 7/2012 | Hsu | |
| 2015/0091859 A1 | 4/2015 | Rosenberg et al. | |
| 2015/0355257 A1 | 12/2015 | Wu et al. | |

\* cited by examiner

*Primary Examiner* — Adam R. Giesy

(74) *Attorney, Agent, or Firm* — Slater Matsil, LLP

(57) ABSTRACT

A touchscreen resistive sensor includes a network of resistive sensor branches coupled to a number of sensor nodes arranged at touch locations of the touchscreen. A test sequence is performed by sequentially applying to each sensor node a reference voltage level, jointly coupling to a common line the other nodes, sensing a voltage value at the common line, and declaring a short circuit condition as a result of the voltage value sensed at the common line reaching a short circuit threshold. A current value level flowing at the sensor node to which the reference voltage level is applied is sensed and a malfunction of the resistive sensor branch coupled with the sensor node to which a reference voltage level is applied is generated as a result of the current value sensed at the sensor node reaching an upper threshold or lower threshold.

21 Claims, 6 Drawing Sheets

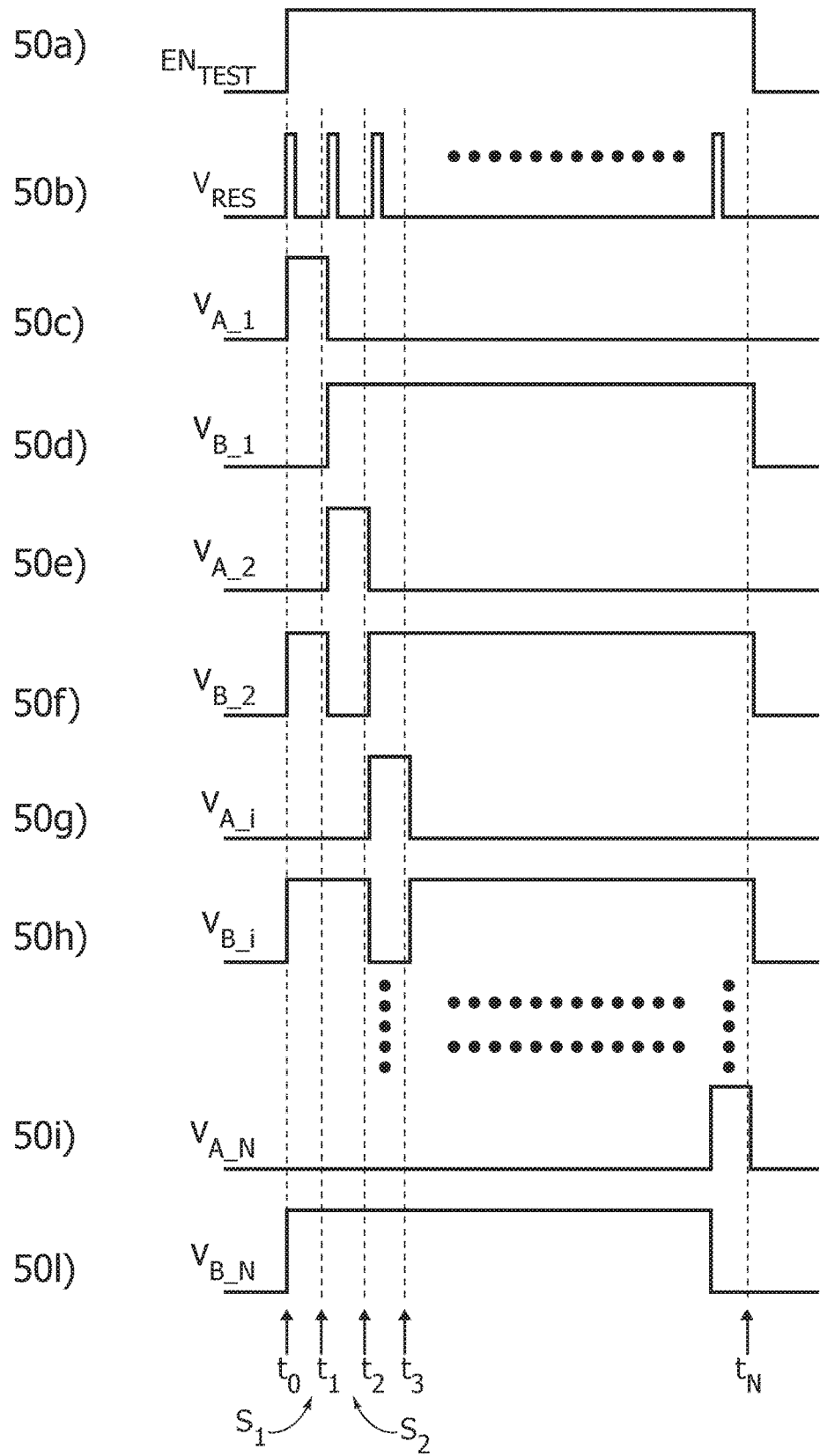

SELF-TEST METHOD, CORRESPONDING CIRCUIT AND DEVICE

CROSS-REFERENCE TO RELATED APPLICATIONS

This application claims priority to Italian Patent Application No. 102018000008022, filed on Aug. 9, 2018, which application is hereby incorporated herein by reference.

TECHNICAL FIELD

Embodiments relate to a self-test method and a corresponding circuit and device, which can be used for example with a touch screen device.

BACKGROUND

The increasing popularity of smart phones and interactive netbooks has led to touch interface being increasingly incorporated in such devices.

Force touch sensors may be used to distinguish between different levels of force being applied to the surface of a touchscreen. Resistive force touch sensors may employ arrays of resistive Wheatstone bridge sensors. The applied force may cause a deformation of the touch panel which then causes a variation of the resistances in the Wheatstone bridge.

Methods for verification of connection integrity of touchpanel sensors traditionally comprise testing the sensors before assembly, for instance carrying out an "open test" and a "short test" during design testing on an engineer work station (hereinafter referred to as an "EWS" testing). However, this has the disadvantage of increasing product cost and test time. Moreover, if a connection failure occurs after EWS testing (during the assembly or during the sensor lifetime, for instance), the sensor functionality could be compromised. Moreover, being able to verify the values of sensor resistances may represent a desirable feature.

Thus, notwithstanding the intensive activity in the field, improved solutions are desirable.

SUMMARY

The description relates to touchscreen panels. One or more embodiments may be applied to Wheatstone bridge sensor arrays in touchscreens. One or more embodiments may be applied to touch panels for smart phones, smartwatches, interactive netbooks, etc.

One or more embodiments can contribute in providing an improved solution as compared to the prior art.

One or more embodiments may relate to a corresponding circuit.

Such a circuit may be associated with, for instance, a touchscreen equipped with a Wheatstone bridge sensor array.

One or more embodiments may relate to a corresponding device.

A mobile communication device may be exemplary of such a device.

One or more embodiments may allow to verify sensor connections by means of a built-in testing circuit.

The claims are an integral part of the technical teaching provided herein with reference to the embodiments.

BRIEF DESCRIPTION OF THE DRAWINGS

One or more embodiments will now be described, by way of non-limiting example only, with reference to the annexed Figures, wherein:

FIG. 6 comprises time diagrams of signals which may occur in embodiments;

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The references used herein are provided merely for convenience and hence do not define the extent of protection or the scope of the embodiments.

Figure 1:
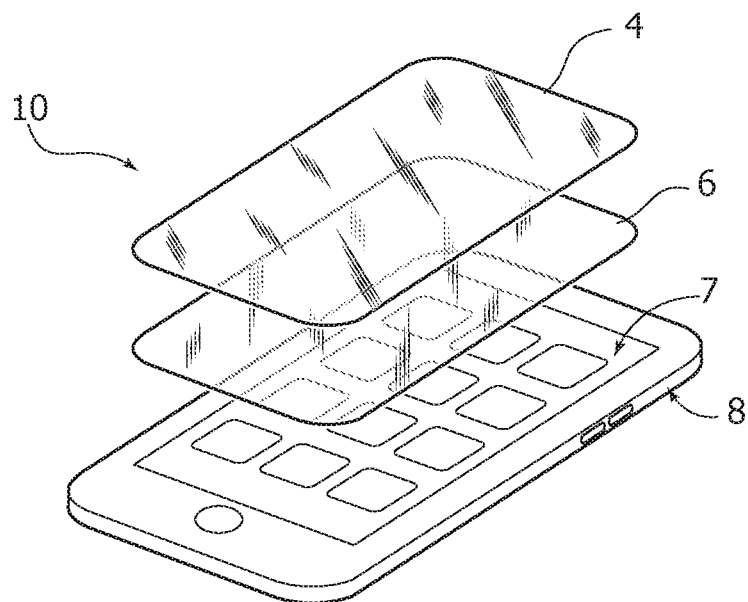
FIG. 1 is an exploded view of a touchscreen device.

A mobile communication device 10, as exemplified in FIG. 1, may incorporate an electronic device 8 comprising a touch interface 7, e.g., a display, to facilitate operation by a user.

A mobile communication device 10 may comprise, for instance, a smart phone, a smart watch, an electronic tablet, a GPS navigation device, and any other mobile communication device which may be configured to be controlled by a user via a touch screen interface 7.

Figure 2:
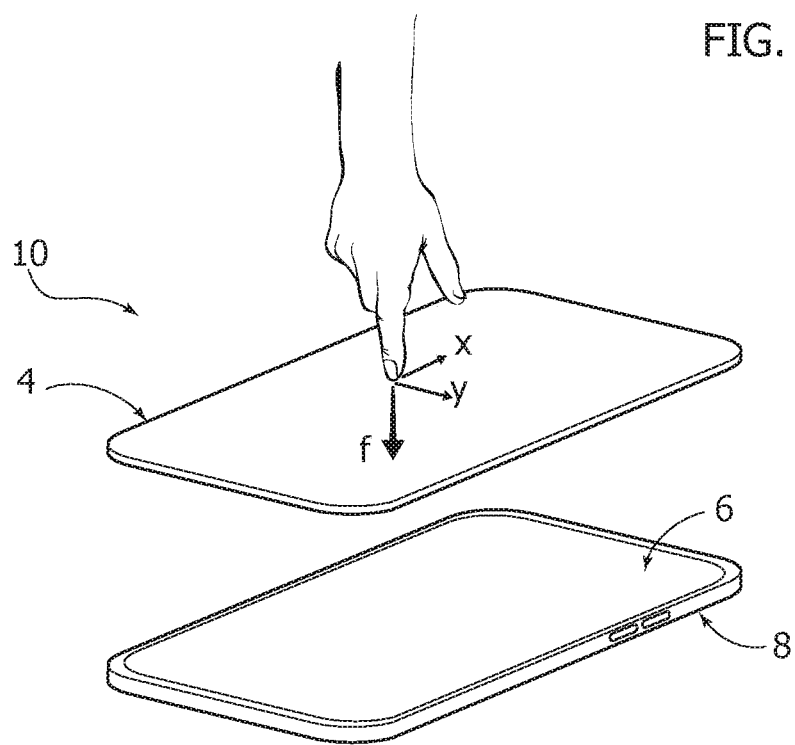
FIG. 2 is an exemplary view of forces applied to a touchscreen.

As exemplified in FIGS. 1 and 2, the touch interface 7 may comprise an array of sensors 6 for sensing a force applied, e.g., by a finger F, onto a touch surface 4.

For instance, the array of sensors 6 may comprise a plurality of resistive touch sensors.

In one or more embodiments, the touch surface 4 may comprise polycarbonate or Gorilla Glass materials.

Figure 3:
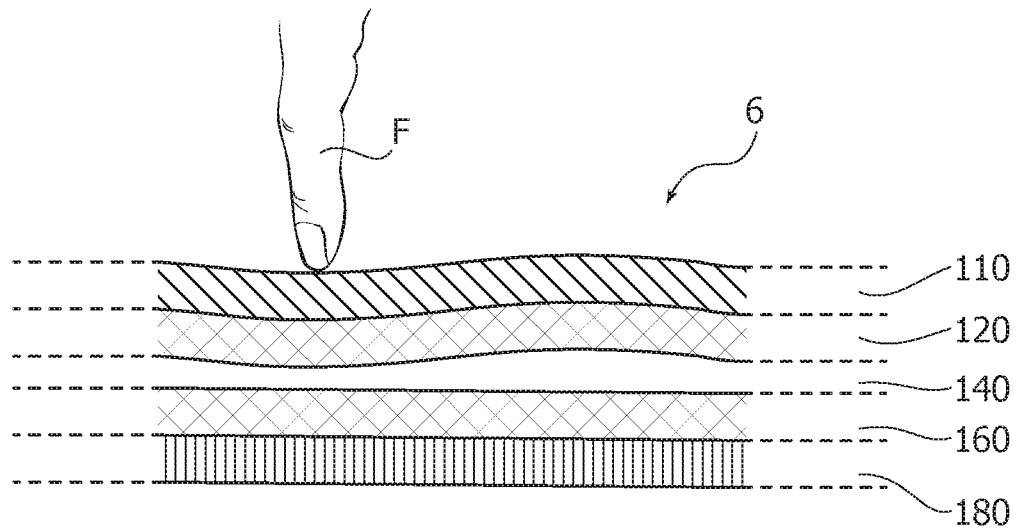
FIG. 3 is exemplary of a stack of layers of a resistive touchscreen.

In one or more embodiments, the touch panel 7, e.g., comprising a resistive touchscreen sensor array 6 as exemplified in FIG. 3, may comprise at least a pair of conductive layers. For instance, the touchscreen sensor array 6 may comprise multiple layers stacked one onto another, from top to bottom:

a flexible top layer 110, comprising a flexible film material, a layer 120, for instance comprising a layer of ITO (Indium-Tin-Oxide) material, a gap 140, comprising e.g., flexible dots, air,
a layer 160, another layer of ITO,
a base 180, e.g., a glass layer.

In one or more embodiments, the touchscreen sensor array 6 may comprise multiple wires attached to the layers 120, 160: a first set (not visible) on, e.g., the left and right sides of layer 120 and a second set (not visible) on, e.g., the top and bottom sides of layer 160.

The touch screen 6 may register the touch of a finger F as it applies a pressure onto the flexible top layer 110, compressing the flexible top layer 110 up to a maximum compression in which, e.g., its surface contacts the top surface of the underlying layer. In fact, a finger touch F may be detected when the user pushes on the touchscreen making the layers contact one another.

Figure 4:
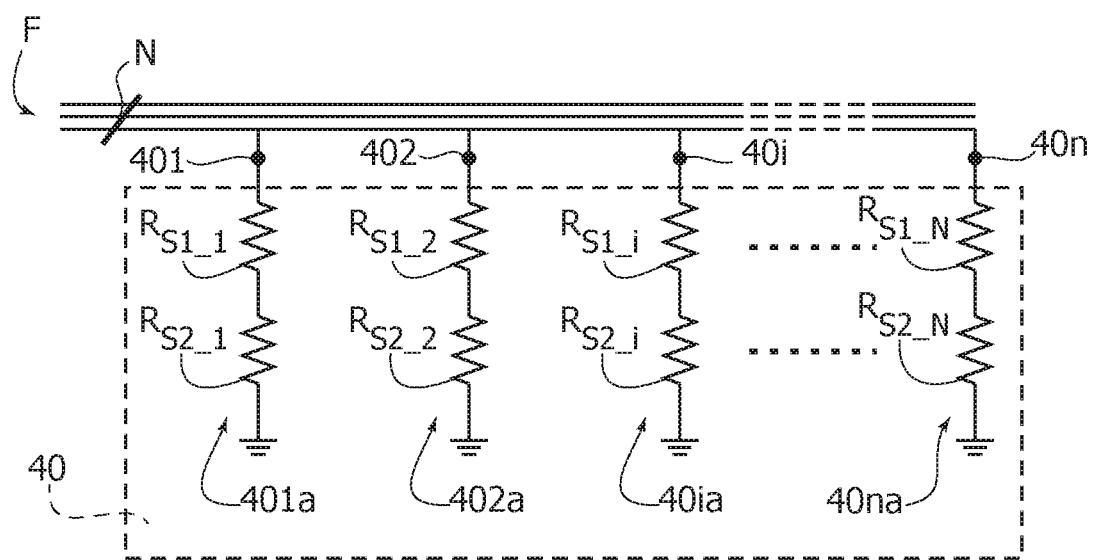
FIG. 4 is a circuit diagram exemplary of a resistive sensor.

In one or more embodiments, a circuit 10 may comprise a sensor 40, for instance as exemplified in FIG. 4.

In one or more embodiments, for instance, force touch sensor 40 may be used to distinguish between different levels of force being applied to a surface of the touchscreen 4, 6, 7 by the finger F or a force or pressure.

As exemplified in FIG. 4, the touch sensor 40 may comprise a network of resistive sensor branches, e.g., comprising a set of resistive sensor branches 401a, 402a, 40ia, 40na.

For the sake of simplicity and ease of description four sensor branches are exemplified herein, being otherwise understood that one or more embodiments may comprise virtually any number of sensor branches.

In fact, the actual number of sensor branches in the sensor 40 may be a number indicative of, e.g., coordinate points on an axis of a Cartesian plane used to represent a position at which pressure F is applied to the touchscreen.

Each sensor branch 40na in the set of sensor branches 401a, 402a, 40ia, 40na may comprise a respective connection node 40n, e.g., a set of sensor connection nodes 401, 402, 40i, 40n which may be selectively coupled to circuits in the electronic device 8.

For the sake of simplicity, the principles underlying operation of the embodiments will be discussed in the following mainly with respect to one sensor branch 40na.

It will be appreciated that this is a non-limiting example. In fact, the same principles may be applied, mutatis mutandis, to (virtually any number of) remaining branches in the set of resistive sensor branches 401a, 402a, 40ia, 40na in the sensor 40.

Each resistive sensor branch 40na may comprise a respective pair of resistances $R_{S1\_N}$, $R_{S2\_N}$, arranged in series, e.g., where a same current may flow from the n-th connection node 40n to a ground node.

In one or more embodiments, the sensor 40 may be configured to operate in different modes, for instance:

in a first mode, e.g., when the bottom surface of the flexible top layer 110 contacts the top surface of the underlying layer, a sensor circuit node 40n is connected, e.g., to the electronic device 8, and there is a flow of current in the respective sensor branch 40na;

in a second mode, e.g., when the contact is released, the circuit 40 is opened and no current flows in the respective sensor branch 40na.

Thus, in one or more embodiments, when any probe F (e.g., a finger, stylus pen, pen, etc.) is used to apply pressure on the top film 110, at least one sensor branch 40na in the sensor 40 is activated.

For instance, in the first mode, activation of the set of sensor branches 401a, 402a, 40ia, 40na results in a voltage drop across at least one sensor branch 40na, e.g., in its respective resistors $R_{s1\_N}$, $R_{s2\_N}$.

In one or more embodiments, the point of contact of the flexible layer 110 may create a voltage divider network, providing a voltage which may be detected by a controller and processed to obtain information as to the touch position where the pressure F is applied based on the coordinates of the touch position or point.

As mentioned in the foregoing, a touch sensor 40 may comprise a set of resistors, e.g., a set of Wheatstone bridges, thus including a set of connections N, e.g., from connection nodes 401, 402, 40i, 40n of the sensor 40 to the electronic device 8, for instance an integer number N of connecting wires from an n-th connection node 40n to a control unit in the electronic device 8.

In one or more embodiments, each connection N of the n-th connection node 40n of each sensor branch 40na in the sensor 40 with user circuits 8 is required to function properly in order to guarantee the reliability of sensor components 40.

In one or more embodiments, a method to ensure proper working functionality may be used to verify that all N connections work properly between respective sensor branches connection nodes 401, 402, 40i, 40n and user circuits, e.g., to electronic device 8 circuits in a mobile communication device 10.

In one or more embodiments, for instance:

a missing sensor connection N may be detected from the increased resistance exhibited by a sensor branch ("open test");

verification of proper working may comprise checking whether the connections N include mutual short circuits ("short test");

resistance values of sensor branches, e.g., $R_{S1\_N}$, $R_{S2\_N}$ may be measured to verify they have values within a certain defined range, otherwise being labeled as malfunctioning.

Figure 5:
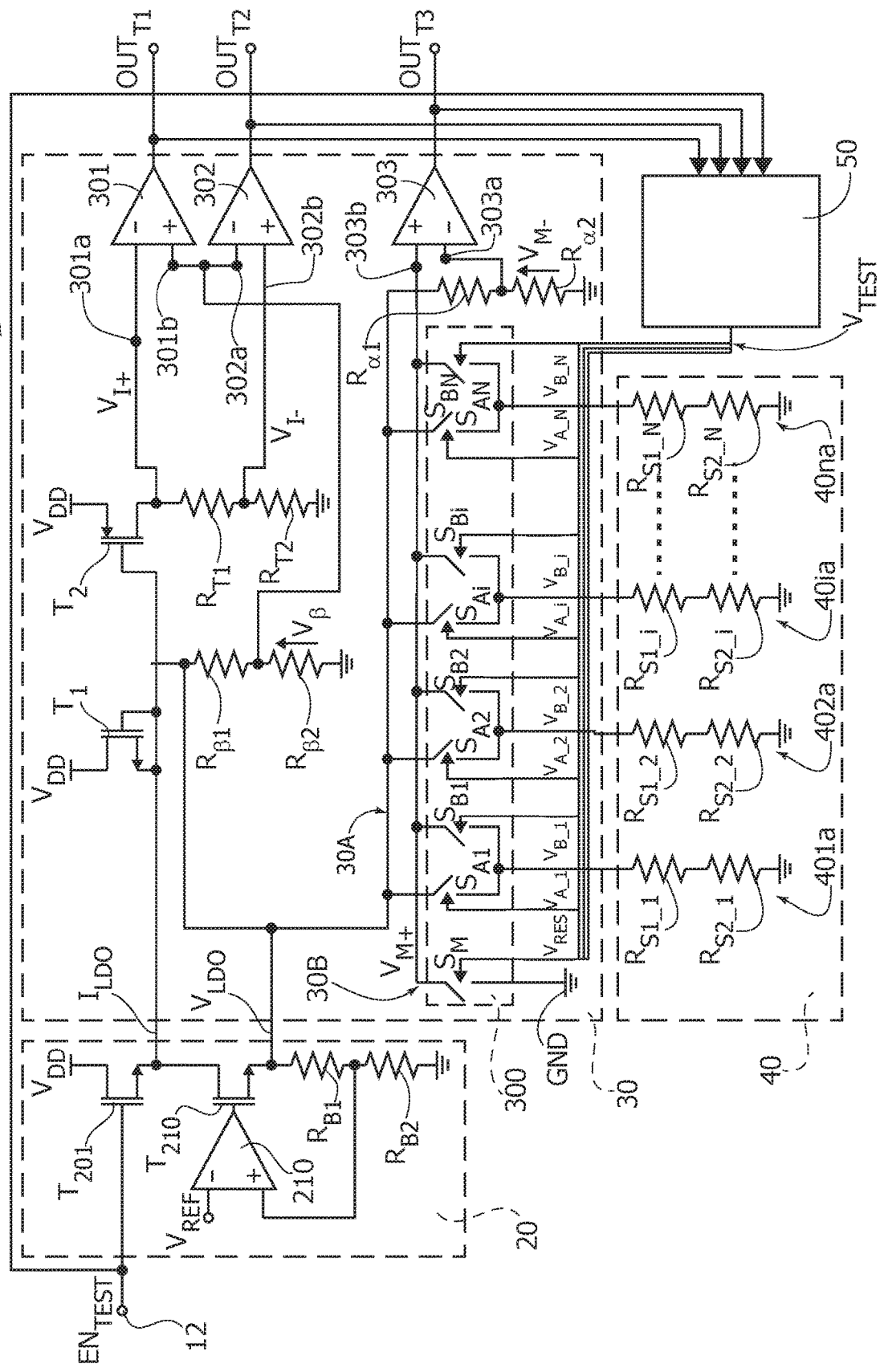
FIG. 5 is a circuit diagram exemplary of embodiments.

One or more embodiments, as exemplified in FIG. 5, may allow to verify the sensor connections N. For instance, acts of verification may be performed before assembly and/or also during lifetime of the sensor.

In one or more embodiments, one or more sensor branches affected by "bad connection" (or malfunctioning by exhibiting a sensor resistance out of a certain defined range, e.g., resistance $R_{S1\_1} > R_{S\_max}$), such as, for instance, a first sensor branch 401a, may be isolated and/or permanently electrically decoupled from the electronic device 8, for instance as a function of output signals triggering a finite state machine as discussed in the following. This facilitates adequate operation of the sensor 40 as provided by the remaining sensor branches which may be assumed to be connected properly.

A circuit 100 as exemplified in FIG. 5 and configured to perform a self-test in a sensor 40 may comprise a self-test node 12, a source circuit 20, for instance comprising a low-dropout regulator (LDO) circuit known per se, a sensor network 40, e.g., resistive touch sensors, comprising a plurality of sensor nodes 401, . . . , 40n, e.g., in connection wired, a control circuit 30, configured to be coupled to the source circuit 20 and to the sensor 40, for instance via connections N, and a finite state machine (FSM) circuit 50 configured to perform a test sequence, which may facilitate to verify the integrity of connections N of the sensor 40.

In one or more embodiments, the sensor network 40 may comprise a number N of respective sensor nodes 401, 402, 40i, 40n arranged at touch locations of the touchscreen 4, 6, 7.

In one or more embodiments, both the source circuit 20 and/or the control circuit 30 may be configured to receive a power supply voltage $V_{DD}$ from a, e.g., common, node (indicated with the same name of the supply voltage for simplicity).

In one or more embodiments as exemplified in FIG. 5, the self-test node 12 may be coupled to the source circuit 20 and to the FSM circuit 50. For instance, the self-test node 12 may receive an enable signal $EN_{TEST}$ and provide the enable signal $EN_{TEST}$ to the source circuit 20 and to the FSM machine circuit 50.

In one or more embodiments, the enable signal may have two states, for instance an active state "1" and an inactive state "o".

In one or more embodiments, the source circuit 20 may receive as input the enable test signal $EN_{TEST}$ and provide as output a reference signal $V_{LDO}$, e.g., a regulated voltage $V_{LDO}$.

In one or more embodiments, the source circuit 20 may be configured to generate a regulated voltage $V_{LDO}$ to provide to the various circuits within the system 10.

In one or more embodiments the source circuit 20 may comprise a first transistor $T_{201}$, receiving as input the enable test signal $EN_{TEST}$, a second transistor $T_{210}$, coupled to the first transistor $T_{201}$, the transistor $T_{210}$ producing a first control signal $V_{LDO}$, e.g., the reference signal $V_{LDO}$, and an error amplifier 210 having a first input coupled to a first reference voltage $V_{REF}$, a second input receiving a feedback signal from a voltage divider $R_{B1}$, $R_{B2}$, and an output coupled to the transistor $T_{210}$.

In one or more embodiments, the reference signal $V_{LDO}$ may be expressed as:

$$V_{LDO} = (1 + R_{B1}/R_{B2}) * V_{REF}$$

In one or more embodiments as exemplified in FIG. 5, the source circuit 20 may be coupled to the control circuit 30, providing the reference signal $V_{LDO}$ to the control circuit 30.

In one or more embodiments, the control circuit 30 may be coupled to the source circuit 20 and to the sensor circuit 40 at input nodes, for instance:
  a first input node $I_{LDO}$,
  a second input node $V_{LDO}$,
  a set of selective test nodes $S_M$, $S_{A1}$, $S_{B1}$, $S_{A2}$, $S_{B2}$, $S_{Ai}$, $S_{Bi}$, $S_{AN}$, $S_{BN}$, e.g., a set of switches 300.

In one or more embodiments, the set of switches 300 may be configured to perform a test sequence by sequentially coupling the source 20 of reference voltage level $V_{LDO}$ to the sensor nodes 401, 402, 40i, 40n, as discussed in the following.

In one or more embodiments, control circuit 30 receives the reference voltage level $V_{LDO}$ and a current $I_{LDO}$ from the input nodes (indicated with the same label of the signals) coupled to the source circuit 20, and a set of test control signals $V_{TEST}$ from the FSM machine circuit 50 controlling the set of switches 300. In one or more embodiments, the FSM machine may be configured to provide control signals $V_{TEST}$ dedicated to performing a test sequence on the sensor 40.

In the following, for the sake of simplicity, one may refer to output signals $OUT_{T1}$, $OUT_{T2}$, $OUT_{T3}$ and output nodes $OUT_{T1}$, $OUT_{T2}$, $OUT_{T3}$ in the control circuit 30 in the circuit 100 by using the same labels.

In one or more embodiments, the control circuit 30 may receive a current signal $I_{LDO}$ from the source circuit 20 and mirror it via a current mirror comprising transistors $T_1$, $T_2$, e.g., BJT or MOSFET transistors. For example, a first transistor $T_1$ and a second transistor $T_2$ may form the current mirror, sensing a current value level flowing at any sensor node in the number N of sensor nodes 401, 402, 40i, 40n to which the reference voltage level $V_{LDO}$ is applied.

In one or more embodiments, the first transistor $T_1$ is coupled to the transistor $T_{201}$ in the source circuit 20 and the second transistor $T_2$, while the second transistor $T_2$ is coupled to the first transistor $T_1$ and to a first set of resistors $R_{T1}$, $R_{T2}$, and to a first 301 and second 302 comparator circuits.

It is noted that transistors $T_1$, $T_2$, $T_{201}$ and $T_{210}$ may be coupled to bias sources, e.g., to bias voltage $V_{DD}$, which may be common among transistors.

In one or more embodiments, the control circuit 30 may also comprise various sets of resistors, comprising:
  a first set of resistors $R_{T1}$, $R_{T2}$, comprising a first resistor $R_{T1}$ and a second resistor $R_{T2}$,
  a second set of resistors $R_{\beta1}$, $R_{\beta2}$, comprising a first parametric resistor $R_{\beta1}$ and a second parametric resistor $R_{\beta2}$ e.g., having values $R_{\beta1} = R_B * \beta$, $R_{\beta2} = R_B * (1-\beta)$, where a parameter $\beta$ has a selectable value;
  a third set of resistors $R_{\alpha1}$, $R_{\alpha2}$, comprising a third variable resistor $R_{\alpha1}$ and a fourth variable resistor $R_{\alpha2}$ e.g., having values $R_{\alpha1} = R_B * (1-\alpha)$ and $R_{\alpha2} = R_B * \alpha$, where a parameter $\alpha$ has a selectable value.

In one or more embodiments, each set of resistors $R_{T1}$, $R_{T2}$; $R_{\beta1}$, $R_{\beta2}$; $R_{\alpha1}$, $R_{\alpha2}$ may implement a voltage divider.

In one or more embodiments, the value $R_B$ may be a bias resistor value.

In one or more embodiments, the control circuit 30 may also comprise a set of comparator circuits 301-302-303. For instance, the set of comparator circuits 301-302-303 may comprise:
  the first comparator circuit 301, e.g., a differential amplifier circuit 301 having a first inverting node 301a, a first non-inverting node 301b, and a first output node $OUT_{T1}$,
  the second comparator circuit 302, e.g., a differential amplifier circuit 302 having a second inverting node 302a, a second non-inverting node 302b and a second output node $OUT_{T2}$,
  a third comparator circuit 303, e.g., a differential amplifier circuit 303 having a third inverting node 303a, a third non-inverting node 303b and a third output node $OUT_{T3}$.

In one or more embodiments, the second set of resistors $R_{\beta1}$, $R_{\beta2}$ are coupled to the second input node $V_{LDO}$, to the set of comparator circuits 301-302-303 and to the third set of resistors $R_{\alpha1}$, $R_{\alpha2}$.

For instance, the node 301a of the first comparator circuit 301 may sense a voltage drop $V_{I+}$ across the first set of resistors $R_{T1}$ and $R_{T2}$.

For example, the node 302b of the second comparator circuit 302 may be sensitive to a voltage drop $V_{I-}$ across the second resistor $R_{T2}$ in the first set of resistors $R_{T1}$, $R_{T2}$.

In one or more embodiments, the node 301b may be coupled to the node 302a and both nodes 301b, 302a may be jointly sensitive to a voltage drop $V_\beta$ across the second parametric resistor $R_{\beta2}$ in the second set of resistors $R_{\beta1}$, $R_{\beta2}$.

In one or more embodiments the control circuit 30 may comprise:
  a "top" branch or line 30A, coupling the second input node $V_{LDO}$ to the node 303a and comprising the third set of resistors $R_{\alpha1}$, $R_{\alpha2}$;
  a "bottom" branch or line 30B, selectively coupling the node 303b to a ground node GND.

The input node 303a, as exemplified in FIG. 5, may thus be sensitive to a voltage drop $V_{M-}$ across the fourth variable resistor $R_{\alpha2}$, e.g., $V_{M-}$ proportional to the source voltage $V_{LDO}$.

In one or more embodiments, as mentioned in the foregoing, the control circuit 30 may also receive a set of test control signals $V_{TEST}$ from the FSM circuit 50.

In one or more embodiments, the set of test control signals $V_{TEST}$ may comprise a number of signals 2*N+1, where N is the number of sensor nodes 401, 402, 40$i$, 40$n$ in the sensor 40.

For instance, in the case of the sensor having N=2 sensor branches 401$a$, 402$a$, the set of test control signals $V_{TEST}$ may be represented as an array having five components:

$$V_{TEST} = [V_{RES}, V_{A\_1}, V_{B\_1}, V_{A\_2}, V_{B\_2}]$$

where:

$V_{RES}$ is a reset signal, $V_{A\_1}, V_{B\_1}$ is a first pair of test signals, $V_{A\_2}, V_{B\_2}$ is a second pair of test signals.

The set of control signals $V_{TEST}$ may operate a set of switches 300 to perform a test sequence, by selectively coupling sensor branches in the sensor 40 to, alternatively, one of:

the line 30A, e.g., having a constant electric voltage potential value $V_{LDO}$ provided by the source between the input node $V_{LDO}$ and ground, the line 30B, e.g., having an electric voltage potential value $V_{M+}$.

Specifically, a reset switch $S_M$ controlled by a reset signal $V_{RES}$ may be dedicated to couple the third non-inverting node 303$b$ to a base voltage GND, e.g., to ground.

For instance, the reset signal $V_{RES}$ may periodically reset the voltage level on the line 30B between subsequent repetitions of the test sequence.

Each signal in the set of test control signals $V_{TEST}$ may thus operate a respective set of switches 300 in the control circuit 30 to selectively couple, sequentially, each sensor branch 40$na$ in the set of sensor branches 401$a$, 402$a$, 40$ia$, 40$na$ to the control circuit 30, thus applying the reference voltage level $V_{LDO}$ sequentially to each connection node in the integer N of connection nodes 401, 402, 40$i$, 40$n$ in the sensor 40.

For instance, in the exemplary case of the sensor 40 comprising two sensor nodes 401, 402 and two sensor branches 401$a$, 402$a$, the set of switches 300 may comprise:

a first pair of switches $S_{A1}$, $S_{B1}$, comprising a first left switch $S_{A1}$, respectively a first "right-hand" switch $S_{B1}$, configured to selectively couple a first sensor branch 401$a$ to the line 30A, respectively to the line 30B, as a function of the first pair of test signals $V_{A\_1}$, $V_{B\_1}$, a second pair of switches $S_{A2}$, $S_{B2}$, comprising a second "left-hand" switch $S_{A2}$, respectively a second right switch $S_{B2}$, configured to selectively couple a second sensor branch 402$a$ to the line 30A, resp. the line 30B, in the control circuit 30, as a function of a second pair of test signals $V_{A\_2}$, $V_{B\_2}$.

It is noted that the control circuit 30 may comprise a number 2*N+1 of switches, for instance an n-th pair of switches $S_{AN}$, $S_{BN}$ where N is the number of sensor branches 401$a$, ..., 40$na$ in the sensor 40 plus at least one reset switch $S_M$.

The control circuit 30 may provide as output, e.g., to a user circuit, a set of output signals $OUT_{T1}$, $OUT_{T2}$, $OUT_{T3}$.

For example, the signals in the set of output signals $OUT_{T1}$, $OUT_{T2}$, $OUT_{T3}$ may have discrete values, e.g., one of two values, indicative of the presence of mutual short circuits (e.g., short circuit signal $OUT_{T3}$) and/or out-of-range resistance values (e.g., malfunctioning signals $OUT_{T1}$, $OUT_{T2}$) in a sensor branch or branches of the sensor 40.

Specifically, a first short circuit signal $OUT_{T3}$ may be indicative of the presence of mutual short circuits, while the remaining malfunctioning signals $OUT_{T1}$, $OUT_{T2}$ may be indicative of resistance values outside the interval set by upper and lower thresholds.

In one or more embodiments, the short and malfunctioning signals $OUT_{T1}$, $OUT_{T2}$, $OUT_{T3}$ of the control circuit 30 may be configured to:

have a first state, e.g., $OUT_{T3}$="1" in at least one period, in case of mutual short circuits, have a second state, e.g., $OUT_{T1}$="1" or $OUT_{T2}$="1" in at least one period in case of sensor resistance out of a defined range (e.g., the range defined by $R_{T1}$ and $R_{T2}$ resistors).

In one or more embodiments, the set of output signals $OUT_T$, $OUT_{T2}$, $OUT_{T3}$ may be provided as input to the FSM circuit 50, together with the enable signal $EN_{TEST}$ from the self-test node 12.

It is noted that output signals $OUT_T$, $OUT_{T2}$, $OUT_{T3}$ are provided, in one or more embodiments, by respective comparator stages 301, 302, 303 which are implemented as operational amplifiers 301, 302, 303. As such, in one or more embodiments, the output of the operational amplifiers 301, 302, 303 may be biased with a bias voltage $V_{DD}$, for instance with a first differential amplifier node V+ at the bias voltage $V_{DD}$ and a second differential amplifier node V− to ground GND.

In fact, if the voltage at the first node V+ (signal and node at which the signal is present are indicated in a same way) is configured to be slightly higher than the voltage at the second node V−, the operational amplifier, thanks to its very high gain, will output a value equal to $V_{DD}$ which can be associated to the logical level "1", particularly in the case of FSM stage 50 comprising logic ports which are powered between a voltage equal to the bias voltage $V_{DD}$ and ground GND. Analogously, if the voltage at the first node V+(signal and terminal at which the signal is present are indicated in a same way) is configured to be slightly lower than the voltage at the second node V−, the operational amplifier, thanks to its very high gain, will output a value equal to ground (0 Volt) which can be associated to the logical level "0", particularly in the case of FSM stage 50 comprising logic ports which are powered between a voltage equal to the bias voltage $V_{DD}$ and ground GND.

As mentioned, the finite state machine (FSM) circuit 50 may thus process the inputs and provide at output the set of test control signals $V_{TEST}$ to operate the set of switches 300 in the control circuit 30, as discussed in the following.

In one or more embodiments, the finite state machine 50 may be coupled to the comparator circuits 301-302-303 and sensitive to the short circuit and malfunctioning signals $OUT_{T3}$, $OUT_{T1}$, $OUT_{T2}$. For instance, the finite state machine 50 may be configured to identify, as a function of the short circuit and malfunctioning signals $OUT_{T3}$, $OUT_{T1}$, $OUT_{T2}$, a location of a fault in the network of resistive sensor branches 401$a$, 402$a$, 40$ia$, 40$na$, e.g., which one sensor branch in the network of sensor branches 401$a$, 402$a$, 40$ia$, 40$na$ is affected by a short circuit or malfunctioning condition.

In one or more embodiments, signals in the system 10 may be clocked with a clock signal, e.g., provided to the FSM circuit 50.

A possible time diagram of signals, e.g., received/provided by the FSM circuit 50, in a system 10 according to embodiments is exemplified in FIG. 6.

Portion 50$a$) of FIG. 6 is a possible time diagram of FSM signals, e.g., the test-enable signal $EN_{TEST}$ provided by the self-test node 12, activating the finite state machine circuit 50, e.g., configured to perform a self-test procedure on the sensor 40.

Portions 50b) to 50e) of FIG. 6 are indicative of possible time diagrams of signals generated in the FSM circuit 50 and provided to the control circuit 30.

For the sake of completeness, portions labeled 50f) to 50l) are also included in FIG. 6 with exemplary possible time diagrams of signals generated in the FSM circuit 50 and provided to the control circuit 30 in order to highlight the possibility for embodiments to include virtually any number of sensor branches. The following detailed description will be limited for simplicity to diagrams 50a) to 50f).

In particular, the reset signal $V_{RES}$ may be an internal clock signal, e.g., having period $T=t_2-t_1$ as discussed in the following.

As shown in FIG. 6, at a first time to, the self-test system 10 is "activated" as the test enable signal $EN_{TEST}$ switches to a first value, e.g., $EN_{TEST}="1"$.

While $EN_{TEST}$ is at the first value, the finite state machine 50 may generate, sequentially, a number N of signals where N is the number of sensor branches to test. In fact, the finite state machine has N states and it employs N periods to detect mutual short circuits, e.g., between sensor branches in the sensor 40. For instance, the FSM circuit 50 performs the test sequence which lasts as number of periods/cycles equal to the number of sensor branches to test.

As noted, for the sake of simplicity, the following discussion of working principles of embodiments is provided mainly with respect to a sensor 40 comprising a quantity N=2 of sensor branches, e.g., a first sensor branch 401a and a second sensor branch 402a.

In a simple case, as discussed in the foregoing, of N=2 sensor branches 401a, 402a, at a rising edge of the reset signal $V_{RES}$, i.e., when $V_{RES}="1"$ at to, the FSM circuit goes in a first state $S_1$, wherein:

a first test signal $V_{A\_1}$ in the first pair of test signals $V_{A\_1}$, $V_{B\_1}$ has a first value, e.g., $V_{A\_1}="1"$;

a second test signal $V_{B\_1}$ in the first pair of test signals $V_{A\_1}$, $V_{B\_1}$ has a value opposite to that of the first test signal, e.g., $V_{B\_1}=\text{not}(V_{A\_1})="0"$;

a first test signal $V_{A\_2}$ in the second pair of test signals $V_{A\_2}$, $V_{B\_2}$ has a value opposite to that of the first test signal in the first pair of test signals $V_{A\_1}$, $V_{B\_1}$, e.g., $V_{A\_2}=\text{not}(V_{A\_1})="0"$, and a second test signal $V_{B\_2}$ in the second pair of test signals $V_{A\_2}$, $V_{B\_2}$ has a value, e.g., $V_{B\_2}="1"$.

In a first cycle of period T, the reset signal $V_{RES}$ goes to a value $V_{RES}="0"$ at time $t=T/2$ and then, at time $t=t_1$ end of the period, it goes back to the first value $V_{RES}="1"$.

In this specific example of two sensor branches 401a, 402a, during the first state $S_1$, a set of test control signals in a first state $V_{TEST}(S_1)$ may be expressed as:

$$V_{TEST}(S_1)=[V_{RES},V_{A\_1}=1,V_{B\_1}=0,V_{A\_n}=0,V_{B\_n}=1]$$

When the control circuit 30 receives the test control signal in the first state $V_{TEST}(S_1)$, the switches in the set of switches 300 are operated as follows:

switch "on" the reset switch $S_M$, e.g., coupling the non-inverting input 303b to ground GND, switch "on" only one "left-hand" switch, e.g., the first left switch $S_{A1}$ and switch "off" all remaining left switches $S_{A2}$, e.g., coupling the first sensor branch to the line 30A, switch "on" all "right-hand" switches but one, e.g., the first right switch $S_{B1}$, e.g., coupling all sensor branches except one to the common line 30B, e.g., save the first sensor branch 401a.

Thus, in the example considered here, in the first period T of the reset signal $V_{RES}$:

the first sensor branch 401 is coupled to the line 30A, all the remaining N−1 sensor branches (in the example considered here, these are represented by simplicity by the second sensor branch 402a) are coupled to the line 30B.

At time $t=t_1$ the reset signal $V_{RES}$ has completed a cycle and thus it triggers the finite state machine to go to a second state $S_2$.

In general, at the i-th clock period of the reset signal $V_{RES}$, the finite state machine circuit 50 is in a i-th state in which it generates a set of signals $V_{TEST}(S_i)$ in the i-th state $S_i$, which may be expressed as:

$$V_{TEST}(S_i)=[V_{RES},V_{A\_1}=0,V_{B\_1}=1,\ldots,V_{A\_i}=1,V_{B\_i}=0, V_{A\_n}=0,V_{B\_n}=1]$$

In one or more embodiments, thus, the finite state machine (FSM) circuit 50 is configured to generate the set of control signals $V_{TEST}$ to operate the set of switches 300 in the control circuit 30 so that:

in the first period of $V_{RES}$, e.g., $t_1-t_0$, the first sensor branch 401a in the sensor 40 is coupled to the line 30A whereas all the remaining branches are coupled to the line 30B, in the second period of $V_{RES}$, e.g., $t_2-t_1$, a second branch 402a in the sensor 40 is coupled to the line 30A whereas all the remaining branches are coupled to the line 30B.

Such a sequence may progress until in the i-th period $t_i-t_{i-1}$, the i-th sensor branch 401a in the sensor 40 is connected to the line 30A whereas all the remaining branches are coupled to the line 30B.

In one or more embodiments, the comparator circuits 301-302-303 may be configured so that their output signals $OUT_{T1}$, $OUT_{T2}$, $OUT_{T3}$ are sampled at times $t_1, t_2, t_3, \ldots, t_n$, e.g., on rising edges of the clock signal $V_{RES}$. This may facilitate providing output signals $OUT_{T1}$, $OUT_{T2}$, $OUT_{T3}$ having a stable output voltage level.

In one or more embodiments, the output signal $OUT_{T3}$ may switch to a level equal to "1" in at least a period T of the clock signal $V_{RES}$, as a result of the voltage $V_{M+}$ on the line 30B reaching a (short circuit) threshold of the comparator 303.

This may be indicative of the line 30B having been "pulled up" as a result of the occurrence of any one of the (mutual) short circuit conditions exemplified in FIG. 7, which includes FIGS. 7A-7D.

Figure 7A:
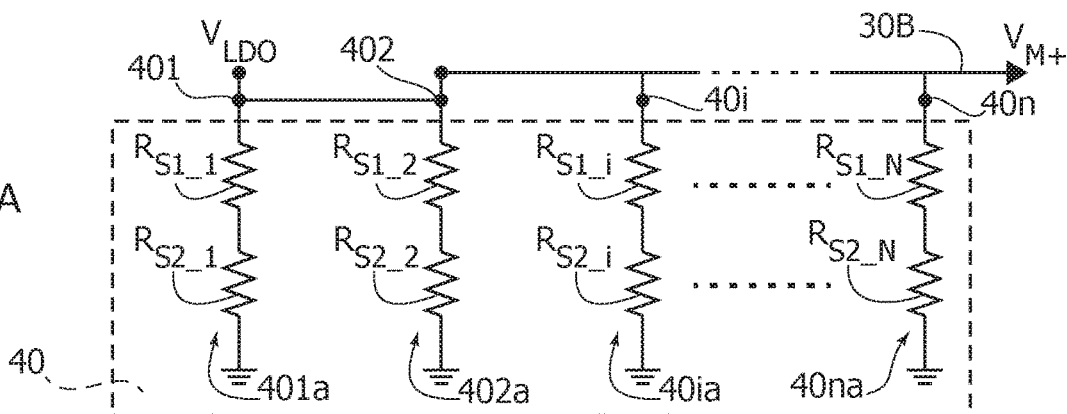
FIG. 7, which includes FIGS. 7A-7D, comprises circuit diagrams exemplary of embodiments.

In a first example of FIG. 7A, a possible mutual short circuit may be present between the first connection node 401 of the first sensor branch 401a and a second connection node 402 in a second sensor branch 402a.

In the first state $S_1$ of the FSM circuit 50 (e.g., during the time interval between to and t1) only the first sensor branch 401a is coupled to the source voltage $V_{LDO}$ while the others aren't. Nevertheless, due to the presence of the mutual short circuit, also the remaining sensor branches have a voltage drop across which is not zero and which is sensed by the third comparator stage 303. Thus, during the first interval $t_1-t_0$, in case of a short circuit as exemplified in of FIG. 7A, the voltage level $V_{M+}$ on the line 30B may be equal to the source voltage level $V_{M+}=V_{LDO}$.

Figure 7B:
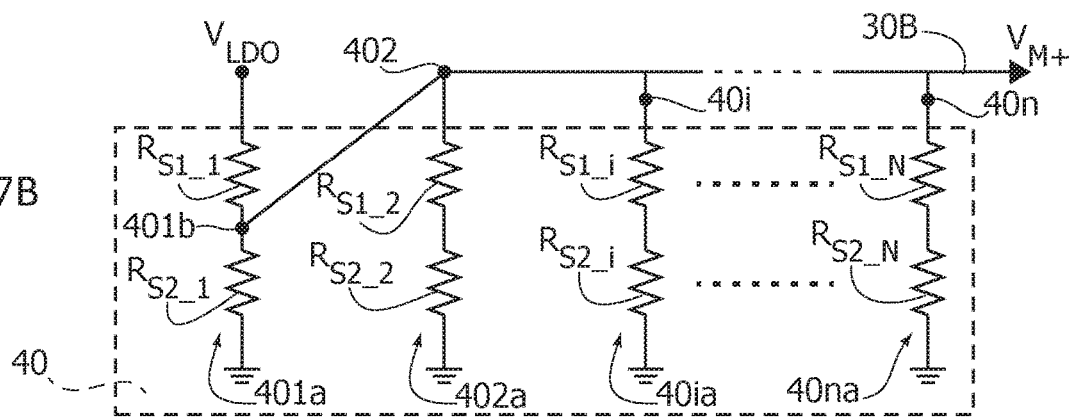

In portion FIG. 7B, another possible arrangement of a mutual short circuit between the first sensor branch 401a and the second sensor branch 402a is shown. In this second arrangement, the mutual short circuit is between the connection node 402 of the second sensor branch 402a and a node 401b between the series resistors $R_{S1\_1}$, $R_{S2\_1}$ in the first sensor branch 401a.

Again, in the first state $S_1$ of the FSM circuit 50, the voltage $V_{M+}$ is non-zero and may be expressed as:

$$V_{M+} = V_{L_{D_O}} \cdot \left(\frac{2}{N+3}\right)$$

Figure 7C:
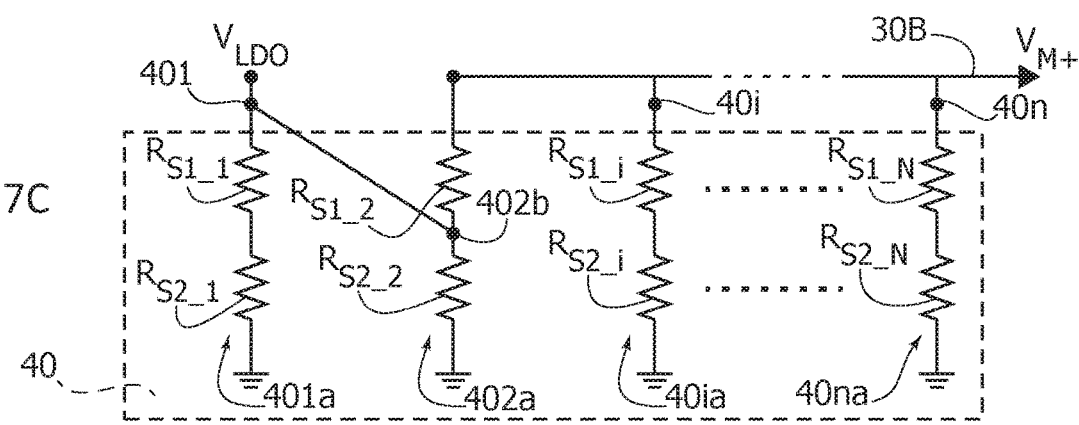

In a third example as shown in FIG. 7C, the mutual short circuit may be present between the connection node 401 of the first sensor branch 401*a* and a node 402*b* of the second sensor branch 402*a*.

In an exemplary case according to FIG. 7C, the voltage $V_{M+}$ on the line 30B may be expressed as:

$$V_{M+} = V_{L_{D_O}} \cdot \frac{2}{N}$$

Figure 7D:
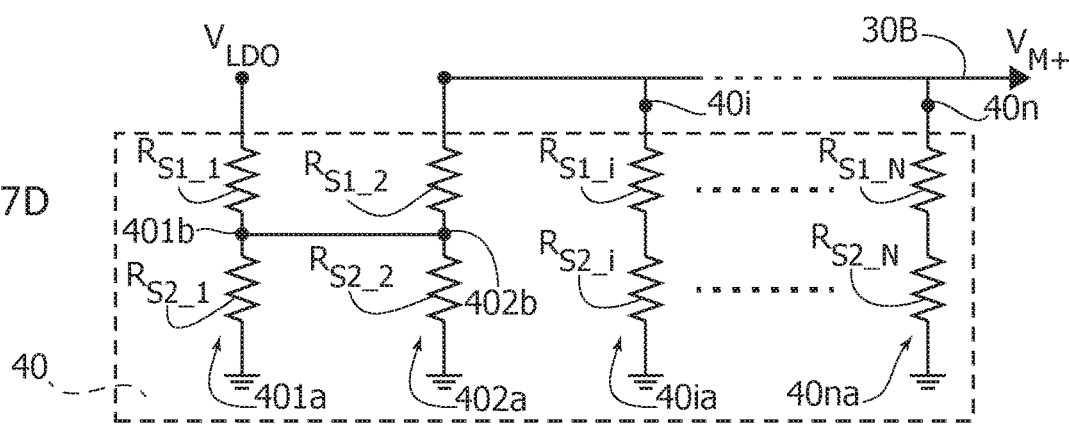

In a fourth example as in FIG. 7D, the mutual short circuit may be between the node 401*b* and the node 402*b* between respective series resistances $R_{S1\_1}$, $R_{S2\_1}$ and $R_{S1\_2}$, $R_{S2\_2}$ in the respective first and second sensor branches 401*a*, 402*a*.

In a scenario according to FIG. 7D, the voltage $V_{M+}$ on the line 30B may be expressed as:

$$V_{M+} = V_{L_{D_O}} \cdot \left(\frac{2}{4 \cdot N - 2}\right)$$

To correctly detect all possible mutual short circuits the parameter $\alpha$ is thus selected to have a value expressed as:

$$\alpha < \min\left(1, \frac{2}{N+3}, \frac{2}{N}, \frac{2}{4 \cdot N - 2}\right)$$

For instance, in the example with N=2 sensor branches, the parameter $\alpha$ may have a value $\alpha=\min(1, 2/5, 2/2, 2/(8-2))=\frac{1}{3}=0.33$.

As a consequence of this choice, the third comparator 303 may receive as input the voltage $V_{M+}$ on the line 30B and a voltage drop $V_{M-}$ across the fourth variable resistor $R_{\alpha 2}$, where $V_{M-}$ is proportional to the source voltage $V_{LDO}$, e.g., a scaled replica having a value expressed as:

$$V_{M-}=R_{\alpha 2}/(R_{\alpha 1}+R_{\alpha 2})*V_{LDO}=\alpha*V_{LDO}.$$

In this way $OUT_{T3}$ may be equal to "1" if any possible short circuit connection arrangement occurs, as exemplified in FIG. 7.

Figure 8:
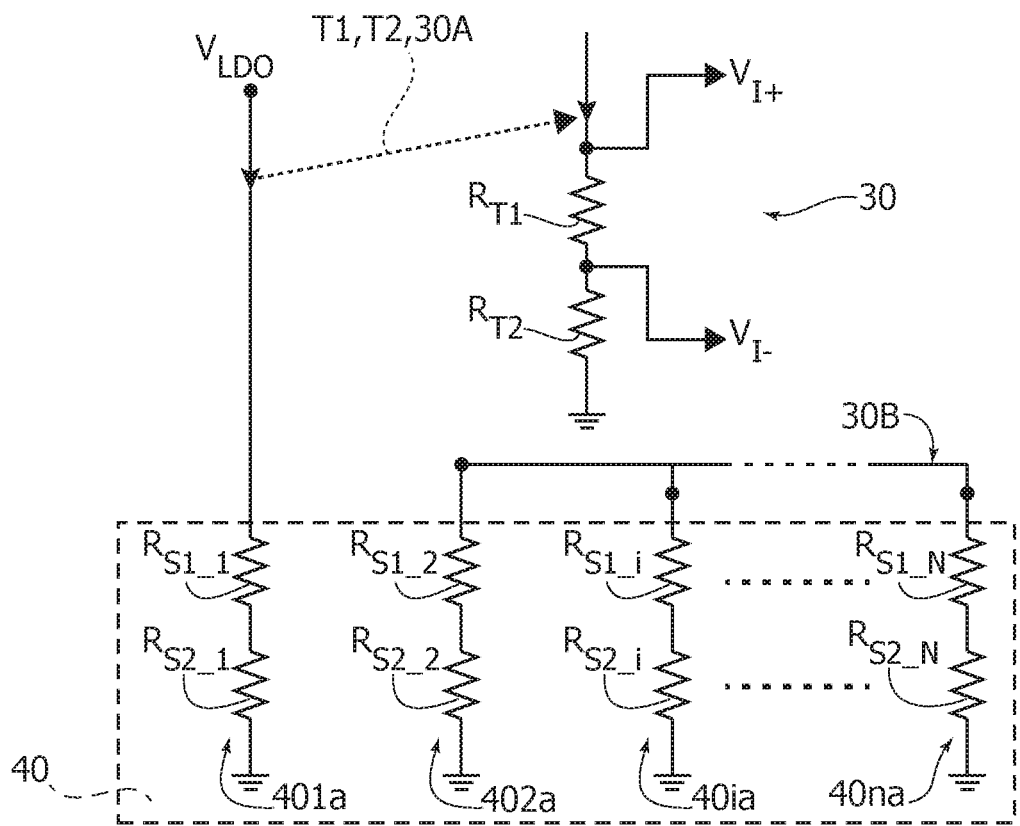
FIG. 8 is a circuit diagram exemplary of a portion of FIG. 5.

FIG. 8 presents an example to illustrate how the circuit may detect the presence of a resistor in any sensor branch in the set of sensor branches 401*a*, 402*a*, 40*ia*, 40*na* whose value is outside a desired range.

As shown in FIG. 8, in fact, when the FSM circuit 50 is in the first state $S_1$ (e.g., during the time interval between t0 and t1 of FIG. 6), the tension across the first set of resistors $R_{T1}$ and $R_{T2}$ has a value $V_{I+}$ and $V_{I-}$ to be applied to the input nodes of comparators 301, 302.

In one or more embodiments, while the sensor branch 401*a* is coupled to the line 30A, it has a current flowing $I=V_{LDO}/(R_{S1\_N}+R_{S2\_N})$. Consequently, via current mirroring $T_1$, $T_2$ the same current flowing in the sensor branch 401*a* goes into the first set of resistors $R_{T1}$, $R_{T2}$, in such a way that the signals applied to the inputs 301*a*, 302*b* of the comparator circuits 301, 302 have values $V_{I+}$, $V_{I-}$ which may be expressed as:

$$V_{I+}=(R_{T1}+R_{T2})*V_{LDO}/(R_{S1\_1}+R_{S2\_1})$$

$$V_{I-}=(R_{T2})*V_{LDO}/(R_{S1\_1}+R_{S2\_1})$$

At the same time, the remaining input nodes 301*b*, 302*a* of the comparator stages 301, 302 are coupled to a same node receiving a threshold voltage $V_\beta$. For instance, the threshold voltage $V_\beta$ may be the voltage drop across the second set of parametric resistors $R_{\beta 1}$, $R_{\beta 2}$. Thus, the threshold voltage $V_\beta$ may be a function of the parameter $\beta$ and may be expressed as: $V_\beta=(R_{\beta 2}/R_{\beta 1}+R_{\beta 2}))*V_{LDO}=\beta*V_{LDO}$.

In one or more embodiments, the first and second output signals $OUT_{T1}$, $OUT_{T2}$ may be a function of the differences of the signals $V_{I+}$, $V_\beta$ and $V_{I-}$, $V_\beta$, for instance:

$$OUT_{T1} \propto V_\beta - V_{I+}$$

$$OUT_{T2} \propto V_{I-} - V_\beta$$

In one or more embodiments, the output $OUT_{T1}$ and $OUT_{T2}$ may switch to a value, e.g., "1", when the resistance and parametric resistances values satisfy the following conditions:

$$\beta \cdot V_{L_{D_O}} > (R_{T_1} + R_{T_2}) \cdot \frac{V_{L_{D_O}}}{R_{S_1} + R_{S_2}}$$

$$\beta \cdot V_{L_{D_O}} < R_{T_2} \cdot \frac{V_{L_{D_O}}}{R_{S_1} + R_{S_2}}$$

In one or more embodiments, thus, the resistance values $R_{T1}$, $R_{T2}$ of resistors in the set of resistors $R_{T1}$, $R_{T2}$ may be selected as to be indicative of upper and lower resistance threshold values $R_{S\_max}$, $R_{S\_min}$, for instance satisfying the following expressions:

$$R_{T1}=R_{S\_max}-R_{S\_min}$$

$$R_{T2}=R_{S\_min}$$

Consequently, the output $OUT_{T1}$ and $OUT_{T2}$ switch to a value, e.g., "1", if $$R_{T_1} + R_{T_2} < \frac{R_{S_{min}}}{\beta} \text{ and } R_{T_1} + R_{T_2} > \frac{R_{S_{max}}}{\beta},$$

thus facilitating to verify if the sensor branches resistors are out of the desired range.

In one or more embodiments, in case of sensor resistance out of a defined range (defined by $R_{T1}$ and $R_{T2}$ resistor) the comparator circuits 301 and 302 in the control circuit 30 in the circuit 10 may provide output signals $OUT_{T1}$ or $OUT_{T2}$, respectively, which may be equal to "1" in at least a clock period T.

It is noted that the described way of operating the FSM circuit 50 is in no way the only possible way of operating the FSM circuit 50. Any finite state machine logic capable of providing a sequential connection of sensor branches alternatively to a line 30A or a line 30B of a control circuit may be implemented in the FSM circuit 50.

In the operating mode, all the branches 401a, ..., 40na working properly, i.e., not presenting mutual short circuits, may be coupled to the line 30A in the control circuit 30. On the other hand, sensor branches presenting bad connections, due to their malfunctioning, may be decoupled, e.g., via the finite state machine control signals.

Moreover, together with the assessment of the presence of either one of mutual short circuits, and/or out of range resistors, the finite state machine circuit 50 may also comprise a logic to permanently de-couple the malfunctioning sensor branches from the control circuit 30 which may lead to those malfunctioning sensor circuits to have their connections with the electronic device 8 abandoned in order not to provide erroneous information to the electronic device 8.

In one or more embodiments, the circuit 100 may be embedded in a device 10, e.g., a mobile communication device.

In one or more embodiments a method may comprise:

providing a touchscreen resistive sensor (for instance, 4, 6, 7; 40) comprising a network of resistive sensor branches (for instance, 401a, 402a, 40ia, 40na) coupled to a number N of respective sensor nodes (for instance, 401, 402, 40i, 40n) arranged at touch locations (for instance, F) of the touchscreen, performing a test sequence (for instance, $V_{TEST}$) by sequentially applying (for instance, $S_{A1}$, $S_{A2}$, $S_{Ai}$, $S_{AN}$, 300, 30A, 50) to each sensor node (for instance, 401, 402, 40i, 40n) in the number N of sensor nodes a reference voltage level (for instance, $V_{LDO}$), and i) jointly coupling (for instance, $S_{B1}$, $S_{B2}$, $S_{Bi}$, $S_{BN}$, 300, 30B, 50) to a common line (for instance, 30B, $V_{M+}$) the other nodes in the number N of sensor nodes, sensing (for instance, 303) a voltage value at the common line to which the other nodes in the number N of sensor nodes are jointly coupled and declaring a short circuit condition (for instance, $OUT_{T3}$) of the touchscreen resistive sensor as a result of the voltage value sensed at the common line reaching a short circuit threshold (for instance, 303, $V_{M-}$);

ii) sensing (for instance, $T_1$, $T_2$, $R_{T1}$, $R_{T2}$) a current value level flowing at the sensor node in the number N of sensor nodes to which the reference voltage level (for instance, $V_{LDO}$) is applied (for instance, 30A), and declaring malfunctioning (for instance, $OUT_{T1}$, $OUT_{T2}$) of the resistive sensor branch (for instance, 401a, 402a, 40ia, 40na) coupled with the sensor node in the number N of sensor nodes to which a reference voltage level is applied as a result of the current value sensed (for instance, $T_1$, $T_2$, $R_{T1}$, $R_{T2}$) at the sensor node in the number N of sensor nodes to which the reference voltage level is applied reaching an upper threshold (for instance, 301, $V_\beta$) or a lower threshold (for instance, 302, $V_\beta$).

One or more embodiments, may comprise repeating the test sequence and resetting (for instance, $V_{RES}$, $S_M$) to a base voltage (for instance, GND) the common line (for instance, 30B, $V_{M+}$) between subsequent repetitions of the test sequence.

One or more embodiments may comprise generating at least one of the short circuit threshold, the upper threshold and the current threshold as a function of the reference voltage level.

One or more embodiments may comprise generating the short circuit threshold proportional to the reference voltage level as a function (for instance, $R_{\alpha 1}$, $R_{\alpha 2}$) preferably via an inverse proportionality function, of the number N of sensor nodes.

One or more embodiments may comprise generating the upper threshold and the lower threshold proportional (for instance, $R_{\beta 1}$, $R_{\beta 2}$) to the reference voltage level.

In one or more embodiments, a circuit (for instance, 100) may be configured to be coupled to a touchscreen resistive sensor (for instance, 4, 6, 7; 40) comprising a network of resistive sensor branches (for instance, 401a, 402a, 40ia, 40na) coupled to a number N of respective sensor nodes (for instance, 401, 402, 40i, 40n) arranged at touch locations (for instance, F) of the touchscreen, wherein the circuit comprises:

a source (for instance, 20) of a reference voltage level (for instance, $V_{LDO}$);

a set of switches (for instance, 300) configured to perform a test sequence (for instance, $V_{TEST}$) by:

i) sequentially coupling (for instance, $S_{A1}$, $S_{A2}$, $S_{Ai}$, $S_{AN}$, 300, 30A, 50) the source of reference voltage level to the sensor nodes (for instance, 401, 402, 40i, 40n) in the number N of sensor nodes to sequentially apply (for instance, $S_{A1}$, $S_{A2}$, $S_{Ai}$, $S_{AN}$, 300, 30A, 50) the reference voltage level thereto, and ii) jointly coupling (for instance, $S_{Bi}$, $S_{B2}$, $S_{Bi}$, $S_{BN}$, 50, 300) to a common line (for instance, 30B, $V_{M+}$) the nodes in the number N of sensor nodes other than the sensor node in the number N of sensor nodes to which the reference voltage level is applied, a first comparator circuit block (for instance, 303) coupled to the common line, the first comparator circuit block configured to compare with a short circuit threshold (for instance, 303, $V_{M-}$) the voltage value sensed at the common line and produce a short circuit signal (for instance, $OUT_{T3}$) indicative of a short circuit condition of the touchscreen resistive sensor as a result of the voltage value sensed at the common line reaching a short circuit threshold;

a current sensor circuit block (for instance, $T_1$, $T_2$, $R_{T1}$, $R_{T2}$) configured to be coupled to the set of switches to sense a current value level (for instance, $V_{I+}$, $V_{I-}$) flowing at the sensor node in the number N of sensor nodes to which the reference voltage level is applied, a second comparator circuit block (for instance, 301, 302) coupled to the current sensor circuit block, the second comparator circuit block configured to compare with an upper threshold (for instance, 301, $V_\beta$) and a lower threshold (for instance, 302, $V_\beta$) the current value sensed (for instance, $T_1$, $T_2$, $R_{T1}$, $R_{T2}$) at the sensor node in the number N of sensor nodes to which the reference voltage level is applied (for instance, 30A) and produce at least one malfunctioning signal (for instance, $OUT_{T1}$, $OUT_{T2}$) indicative of malfunctioning of the resistive sensor branch (for instance, 401a, 402a, 40ia, 40na) coupled with the sensor node in the number N of sensor nodes to which a reference voltage level is applied as a result of the current value sensed at the sensor node in the number N of sensor nodes to which the reference voltage level is applied reaching one of the upper threshold or the lower threshold.

One or more embodiments may comprise a reset switch (for instance, $S_M$) configured to couple (for instance, $V_{RES}$) the common line to a base voltage (for instance, GND) between subsequent repetitions of the test sequence (for instance, $V_{TEST}$).

One or more embodiments may include a finite state machine (for instance, 50) configured to control the set of switches in performing the test sequence, wherein the finite state machine is coupled to the first (for instance, 303) and the second (for instance, 301, 302) comparator circuit blocks and sensitive to the short circuit and malfunctioning signals (for instance, $OUT_{T3}$, $OUT_{T1}$, $OUT_{T2}$) therefrom, wherein the finite state machine is configured to identify, as a function of the short circuit and malfunctioning signals a resistive sensor branch (for instance, 401a, 402a, 40ia, 40na) in the network of resistive sensor branches affected by a short circuit or malfunctioning condition as a result of a short circuit or malfunctioning signal being issued with the reference voltage level applied to (for instance, 30A) the respective sensor node in the number N of sensor nodes.

In one or more embodiments the first comparator circuit block (for instance, 303) may comprise:

a first input coupled to the common line (for instance, 30B, $V_{M+}$), and a second input coupled to the source of a reference voltage level via a voltage divider (for instance, $R_{\alpha 1}$, $R_{\alpha 2}$).

In one or more embodiments the second comparator circuit block (for instance, 301, 302) may comprise a window comparator arrangement (for instance, 301, 302) comprising: an upper threshold input (for instance, 301a, $V_{I+}$) and a lower threshold input (for instance, 302b, $V_{I-}$) coupled to the current sensor circuit block and configured to receive the current value level flowing at the sensor node in the number N of sensor nodes to which the reference voltage level is applied between the upper threshold input and the lower threshold input, and a common input node (for instance, 301b, 302a) coupled to the source (for instance, 20) of a reference voltage level via a voltage divider (for instance, $R_{\beta 1}$, $R_{\beta 2}$).

In one or more embodiments, a device (for instance, 10), may comprise:

a touchscreen resistive sensor (for instance, 6; 40) comprising a network of resistive sensor branches (for instance, 401a, 402a, 40ia, 40na) coupled to a number N of respective sensor nodes (for instance, 401, 402, 40i, 40n) arranged at touch locations (for instance, F) of the touchscreen (for instance, 6; 40), and a circuit according to any of claims 6 to 10 having the set of switches (for instance, 300) configured to perform the test sequence (for instance, $V_{TEST}$) by:

i) sequentially coupling (for instance, $S_{A1}$, $S_{A2}$, $S_{Ai}$, $S_{AN}$, 50, 300) the source of reference voltage level to the sensor nodes in the number N of sensor nodes to sequentially apply (for instance, $S_{A1}$, $S_{A2}$, $S_{Ai}$, $S_{AN}$, 50, 300) the reference voltage level thereto, and ii) jointly coupling (for instance, $S_{B1}$, $S_{B2}$, $S_{Bi}$, $S_{BN}$) to the common line the nodes in the number N of sensor nodes other than the sensor node in the number N of sensor nodes to which the reference voltage level is applied.

In one or more embodiments, the touchscreen resistive sensor may be a Wheatstone bridge touchscreen resistive sensor (for instance, 4, 6, 7; 40) comprising a network of resistive sensor branches comprising a pair of resistances (for instance, $R_{S1\_1}$, $R_{S2\_1}$, $R_{S1\_2}$, $R_{S2\_2}$, $R_{S1\_i}$, $R_{S2\_i}$, $R_{S1\_N}$, $R_{S2\_N}$) coupled between a respective sensor node in the number N of respective sensor nodes and ground.

In one or more embodiments, the device (for instance 8, 10) may comprise one of an electronic tablet, or a smart phone, or a smart-watch, or a GPS navigation device.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection. The extent of protection is defined by the annexed claims.

What is claimed is:

1. A test method for a touchscreen resistive sensor that comprises a network of resistive sensor branches coupled to a number N of sensor nodes arranged at touch locations of the touchscreen, the method comprising:

performing a test sequence by sequentially applying a reference voltage level to each sensor node in the number N of sensor nodes;

jointly coupling other nodes in the number N of sensor nodes to a common line;

sensing a voltage value at the common line to which the other nodes in the number N of sensor nodes are jointly coupled;

determining a short circuit condition of the touchscreen resistive sensor as a result of the voltage value sensed at the common line reaching a short circuit threshold;

sensing a current level flowing at the sensor node in the number N of sensor nodes to which the reference voltage level is applied; and determining a malfunctioning of the resistive sensor branch coupled with the sensor node in the number N of sensor nodes to which the reference voltage level is applied as a result of the current level sensed at the sensor node in the number N of sensor nodes to which the reference voltage level is applied reaching an upper threshold or a lower threshold.

2. The method of claim 1, comprising repeating the test sequence and resetting the common line to a base voltage between subsequent repetitions of the test sequence.

3. The method of claim 1, comprising generating the short circuit threshold as a function of the reference voltage level.

4. The method of claim 3, comprising generating the short circuit threshold proportional to the reference voltage level as a function preferably via an inverse proportionality function, of the number N of sensor nodes.

5. The method of claim 4, comprising generating the short circuit threshold inversely proportional to the reference voltage level as a function of the number N of sensor nodes.

6. The method of claim 1, comprising generating the upper threshold or the lower threshold as a function of the reference voltage level.

7. The method of claim 6, comprising generating the upper threshold proportional to the reference voltage level.

8. The method of claim 6, comprising generating the lower threshold proportional to the reference voltage level.

9. The method of claim 6, comprising generating the upper threshold and the lower threshold proportional to the reference voltage level.

10. A circuit configured to be coupled to a touchscreen resistive sensor that comprises a network of resistive sensor branches coupled to a number N of respective sensor nodes arranged at touch locations of the touchscreen, wherein the circuit comprises:

a source of a reference voltage level;

a set of switches configured to perform a test sequence by:

i) sequentially coupling the source of the reference voltage level to the sensor nodes in the number N of sensor nodes to sequentially apply the reference voltage level thereto; and ii) jointly coupling the nodes in the number N of sensor nodes other than the sensor node in the number N of sensor nodes to a common line to which the reference voltage level is applied;

a first comparator circuit block coupled to the common line, the first comparator circuit block configured to compare a voltage sensed at the common line with a short circuit threshold and to generate a short circuit signal indicative of a short circuit condition of the touchscreen resistive sensor as a result of the voltage sensed at the common line reaching the short circuit threshold;

a current sensor circuit block coupled to the set of switches to sense a current level flowing at the sensor node in the number N of sensor nodes to which the reference voltage level is applied; and a second comparator circuit block coupled to the current sensor circuit block, the second comparator circuit block configured to compare an upper threshold and a lower threshold with the current level sensed at the sensor node in the number N of sensor nodes to which the reference voltage level is applied and to generate a malfunction signal indicative of malfunctioning of the resistive sensor branch coupled with the sensor node in the number N of sensor nodes to which a reference voltage level is applied as a result of the current level sensed at the sensor node in the number N of sensor nodes to which the reference voltage level is applied reaching the upper threshold or the lower threshold.

11. The circuit of claim 10, wherein the second comparator circuit block is configured to generate a first malfunction signal as a result of the current level sensed at the sensor node reaching the upper threshold and to generate a second malfunction signal as a result of the current level sensed at the sensor node reaching the lower threshold.

12. The circuit of claim 10, comprising a reset switch configured to couple the common line to a base voltage between subsequent repetitions of the test sequence.

13. The circuit of claim 10, further comprising a finite state machine configured to control the set of switches in performing the test sequence.

14. The circuit of claim 13, wherein the finite state machine is coupled to the first and the second comparator circuit blocks and is sensitive to the short circuit and malfunctioning signals.

15. The circuit of claim 14, wherein the finite state machine is configured to identify, as a function of the short circuit and malfunctioning signals, a resistive sensor branch in the network of resistive sensor branches affected by a short circuit or malfunctioning condition as a result of the short circuit or malfunctioning signal being issued with the reference voltage level applied to the respective sensor node in the number N of sensor nodes.

16. The circuit of claim 10, wherein the first comparator circuit block (303) comprises:

a first input coupled to the common line; and a second input coupled to the source of a reference voltage level via a voltage divider.

17. The circuit of claim 10, wherein the second comparator circuit block comprises a window comparator arrangement comprising:

an upper threshold input and a lower threshold input coupled to the current sensor circuit block and configured to receive a value of the current level flowing at the sensor node in the number N of sensor nodes to which the reference voltage level is applied between the upper threshold input and the lower threshold input; and a common input node coupled to the source of a reference voltage level via a voltage divider.

18. A device, comprising:

a touchscreen resistive sensor comprising a network of resistive sensor branches coupled to a number N of respective sensor nodes arranged at touch locations of the touchscreen; and a circuit configured to generate an error signal upon determining an error condition, the circuit having a set of switches configured to perform a test sequence by:

sequentially coupling a reference voltage to the sensor nodes in the number N of sensor nodes to sequentially apply the reference voltage thereto; and jointly coupling to a common line to the nodes in the number N of sensor nodes other than the sensor node in the number N of sensor nodes to which the reference voltage is applied.

19. The device of claim 18, wherein the circuit further comprises:

a first comparator circuit block coupled to the common line, the first comparator circuit block configured to compare a voltage sensed at the common line with a short circuit threshold and to generate a short circuit signal indicative of a short circuit condition of the touchscreen resistive sensor as a result of the voltage sensed at the common line reaching the short circuit threshold;

a current sensor circuit block coupled to the set of switches to sense a current level flowing at the sensor node in the number N of sensor nodes to which the reference voltage is applied; and a second comparator circuit block coupled to the current sensor circuit block, the second comparator circuit block configured to compare an upper threshold and a lower threshold with the current level sensed at the sensor node to generate a malfunction signal indicative of malfunctioning of the resistive sensor branch coupled with the sensor node in the number N of sensor nodes to which a reference voltage level is applied as a result of the current level sensed at the sensor node in the number N of sensor nodes to which the reference voltage level is applied reaching the upper threshold or the lower threshold.

20. The device of claim 18, wherein the touchscreen resistive sensor is a Wheatstone bridge touchscreen resistive sensor comprising the network of resistive sensor branches comprising a pair of resistances coupled between a respective sensor node in the number N of respective sensor nodes and ground.

21. The device of claim 18, wherein the device comprises one of:

an electronic tablet, or a smart phone, or a smart-watch, or a GPS navigation device.

* * * * *